(12) United States Patent　　　(10) Patent No.: US 12,604,544 B2

Maruyama　　　　　　　　　　　　(45) Date of Patent: Apr. 14, 2026

(54) SOLID-STATE IMAGING ELEMENT

(71) Applicant: SONY SEMICONDUCTOR SOLUTIONS CORPORATION, Kanagawa (JP)

(72) Inventor: Shunsuke Maruyama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 542 days.

(21) Appl. No.: 17/998,522

(22) PCT Filed: Apr. 2, 2021

(86) PCT No.: PCT/JP2021/014297

§ 371 (c)(1),
(2) Date: Nov. 11, 2022

(87) PCT Pub. No.: WO2021/240998

PCT Pub. Date: Dec. 2, 2021

(65) Prior Publication Data

US 2023/0187469 A1　　Jun. 15, 2023

(30) Foreign Application Priority Data

May 26, 2020　　(JP) ................................. 2020-091204

(51) Int. Cl.
| | |
|---|---|
| *H10F 39/18* | (2025.01) |
| *H01L 25/065* | (2023.01) |
| *H04N 25/626* | (2023.01) |
| *H04N 25/778* | (2023.01) |
| *H04N 25/78* | (2023.01) |
| *H04N 25/79* | (2023.01) |
| *H10F 39/00* | (2025.01) |

(52) U.S. Cl.
CPC ......... *H10F 39/18* (2025.01); *H01L 25/0657* (2013.01); *H04N 25/626* (2023.01);
(Continued)

(58) Field of Classification Search
CPC .... H10F 39/18; H10F 39/802; H10F 39/8037; H10F 39/8057; H10F 39/807;
(Continued)

(56) References Cited

U.S. PATENT DOCUMENTS

| | | | | |
|---|---|---|---|---|
| 2013/0134449 | A1* | 5/2013 | Chen .................. | H10K 59/1795 |
| | | | | 438/34 |
| 2015/0041937 | A1* | 2/2015 | Yu ......................... | H10F 39/024 |
| | | | | 438/70 |

(Continued)

FOREIGN PATENT DOCUMENTS

| | | |
|---|---|---|
| JP | S1-075563 A | 4/1986 |
| JP | 01-238384 A | 9/1989 |

(Continued)

OTHER PUBLICATIONS

International Search Report and Written Opinion of PCT Application No. PCT/JP2021/014297, issued on Jun. 29, 2021, 15 pages of ISRWO.

*Primary Examiner* — Tucker J Wright
(74) *Attorney, Agent, or Firm* — CHIP LAW GROUP

(57) ABSTRACT

Provided is a solid-state imaging element with which it is possible to minimize crosstalk between different pixel columns while suppressing a decrease in quantum efficiency of a photoelectric conversion unit due to a pixel separating section. The solid-state imaging element includes a plurality of pixels arranged in a two-dimensional matrix in the X direction and the Y direction and including a photoelectric conversion unit (N-type semiconductor thin film) containing a compound semiconductor. In addition, the solid-state imaging element includes a pixel separating section disposed only at a pixel boundary extending in the X direction.

18 Claims, 9 Drawing Sheets

(52) U.S. Cl.
CPC ........... *H04N 25/778* (2023.01); *H04N 25/78* (2023.01); *H04N 25/79* (2023.01); *H10F 39/802* (2025.01); *H10F 39/8037* (2025.01); *H10F 39/8057* (2025.01); *H10F 39/807* (2025.01); *H10F 39/811* (2025.01)

(58) Field of Classification Search
CPC .. H10F 39/811; H10F 39/199; H10F 39/8063; H10F 39/12; H10F 39/182; H10F 39/8023; H10F 39/8027; H10F 39/8053; H10F 39/813; H01L 25/0657; H01L 21/76; H04N 25/626; H04N 25/778; H04N 25/78; H04N 25/79
See application file for complete search history.

(56) References Cited

U.S. PATENT DOCUMENTS

2015/0168303 A1* 6/2015 Trupke ............... G01R 31/2656
324/762.01
2017/0207260 A1* 7/2017 Suzuki .................. H10F 39/809

2019/0319055 A1* 10/2019 Zaizen .................. H10F 39/807

FOREIGN PATENT DOCUMENTS

| | | | |
|----|------------|----|---------|
| JP | 09-037040 | A | 2/1997 |
| JP | 2004-129015 | A | 4/2004 |
| JP | 2011-211123 | A | 10/2011 |
| JP | 2012-156310 | A | 8/2012 |
| JP | 2012-244124 | A | 12/2012 |
| JP | 2013-005297 | A | 1/2013 |
| JP | 2015-119154 | A | 6/2015 |
| JP | 2016-072271 | A | 5/2016 |
| JP | 2016-127264 | A | 7/2016 |
| JP | 2016-158151 | A | 9/2016 |
| JP | 2018-037611 | A | 3/2018 |
| JP | 2018-182020 | A | 11/2018 |
| JP | 2018-186201 | A | 11/2018 |
| JP | 2019-057649 | A | 4/2019 |
| WO | 2012/004923 | A1 | 1/2012 |
| WO | 2018/016181 | A1 | 1/2018 |
| WO | 2018/139110 | A1 | 8/2018 |
| WO | 2019/155841 | A1 | 8/2019 |

* cited by examiner

3

10(11)     10(11)     10(11)     10(11)

$V_A$ 31
30
29
28
27 — N+ InP
21 — N InGaAs
22
23
24
20
25
26
32
34A
35
34B

2

$V_{dd}$     $V_{dd}$     $V_{dd}$     $V_{dd}$

33

12    2    21   31

3
11
11
11
11

13

Y

X

SOLID-STATE IMAGING ELEMENT

CROSS REFERENCE TO RELATED APPLICATIONS

This application is a U.S. National Phase of International Patent Application No. PCT/JP2021/014297 filed on Apr. 2, 2021, which claims priority benefit of Japanese Patent Application No. JP 2020-091204 filed in the Japan Patent Office on May 26, 2020. Each of the above-referenced applications is hereby incorporated herein by reference in its entirety.

TECHNICAL FIELD

The present disclosure relates to a solid-state imaging element.

BACKGROUND ART

Conventionally, a solid-state imaging element having a photoelectric conversion unit containing a compound semiconductor has been proposed (see, for example, Patent Document 1). In the solid-state imaging element described in Patent Document 1, an impurity region is formed as a pixel separating section between all pixels in order to improve crosstalk.

CITATION LIST

Patent Document

Patent Document 1: Japanese Patent Application Laid-Open No. 2012-244124

SUMMARY OF THE INVENTION

Problems to be Solved by the Invention

However, in the solid-state imaging element disclosed in Patent Document 1 described above, the pixel separating section is formed between all the pixels, and thus, the volume of the photoelectric conversion units may be decreased and the quantum efficiency may be reduced.

An object of the present disclosure is to provide a solid-state imaging element capable of minimizing crosstalk between different pixel columns while suppressing a decrease in quantum efficiency of a photoelectric conversion unit due to a pixel separating section.

Solutions to Problems

A solid-state imaging element according to the present disclosure includes: (a) a plurality of pixels arranged in a two-dimensional matrix in an X direction and a Y direction and including a photoelectric conversion unit containing a compound semiconductor; and (b) a pixel separating section disposed only at a pixel boundary extending in the X direction of a pixel column arrayed in the X direction.

MODE FOR CARRYING OUT THE INVENTION

An example of a solid-state imaging element according to embodiments of the present disclosure will be described below with reference to FIGS. 1 to 13. The embodiments of the present disclosure will be described in the following order. Note that the present disclosure is not limited to the following examples. In addition, the effects described in the present specification are illustrative and not restrictive, and may have additional effects.

1. First Embodiment: Solid-state imaging element
1-1 Overall structure of solid-state imaging element
1-2 Pixel circuit
1-3 Configuration of main part
1-4 Modification
2. Second Embodiment: Solid-state imaging element
2-1 Configuration of main part

1. FIRST EMBODIMENT

[1-1 Overall Configuration of Solid-State Imaging Element]

A solid-state imaging element according to the first embodiment of the present disclosure will be described.

Figure 1:
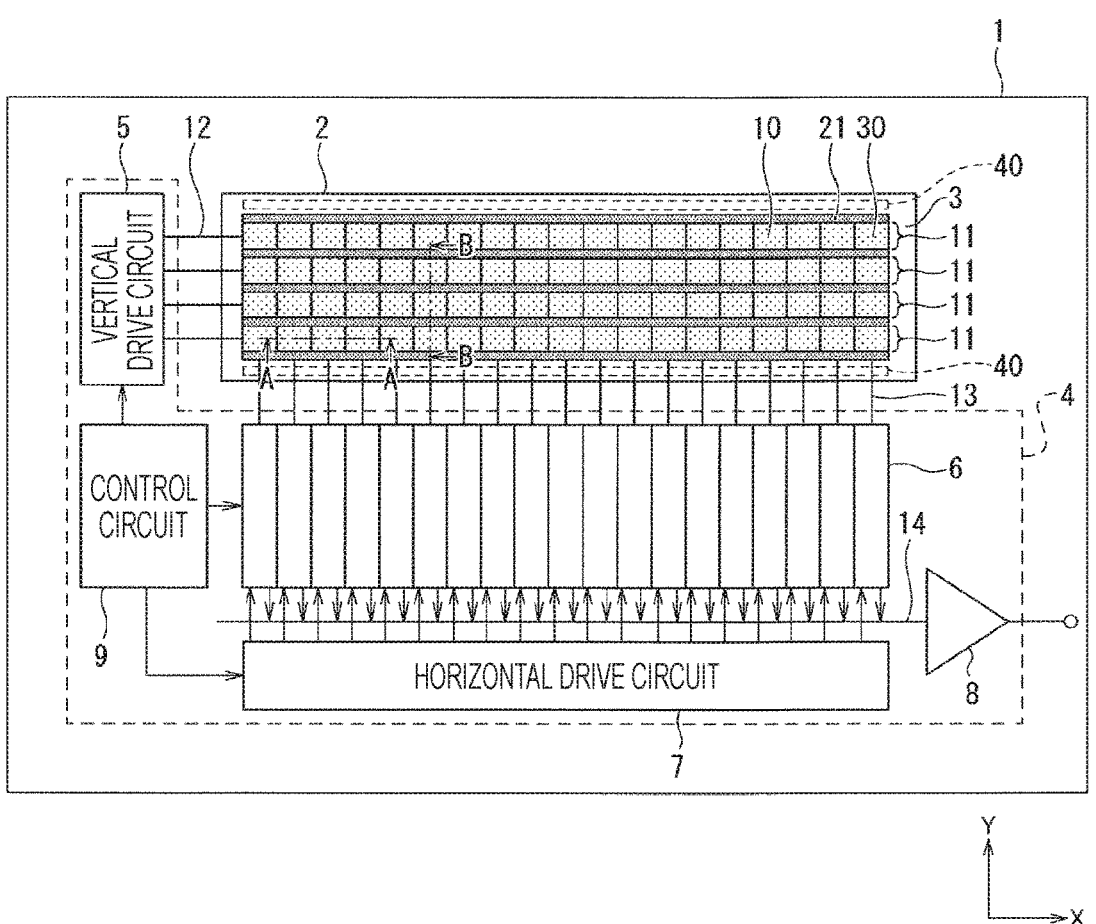
FIG. 1 is a diagram illustrating an overall configuration of a solid-state imaging element according to a first embodiment.

FIG. 1 is a schematic diagram illustrating an overall configuration of the solid-state imaging element according to the first embodiment of the present disclosure. The solid-state imaging element 1 in FIG. 1 is a multi-line sensor including line sensors of multiple columns.

As illustrated in FIG. 1, the solid-state imaging element 1 includes a semiconductor substrate 2, a pixel region 3, and a peripheral circuit 4. In addition, the peripheral circuit 4 includes a vertical drive circuit 5, a column signal processing circuit 6, a horizontal drive circuit 7, an output circuit 8, and a control circuit 9.

The pixel region 3 includes multiple light receiving unit regions (hereinafter also referred to as "pixels 10") arranged in a two-dimensional matrix in an X direction and a Y direction orthogonal to each other on the semiconductor substrate 2. Multiple pixels 10 arranged in the X direction constitute one pixel column (hereinafter also referred to as a "pixel column 11 arranged in the X direction"). FIG. 1 illustrates a case where four pixel columns 11 arranged in the X direction are arrayed in the pixel region 3. Each of the pixel columns 11 constitutes a pixel column of the line sensor. The pixel 10 includes a photoelectric conversion unit and a plurality of pixel transistors. As the plurality of pixel transistors, three transistors that are a reset transistor, a selection transistor, and an amplifier transistor can be employed, for example.

The vertical drive circuit 5 includes, for example, a shift register, selects a desired pixel drive line 12, supplies a pulse for driving the pixels 10 to the selected pixel drive line 12, and drives each pixel 10 on a row-by-row basis. That is, the vertical drive circuit 5 selectively scans each pixel 10 in the pixel region 3 sequentially in the vertical direction on a row-by-row basis, and supplies a pixel signal based on a charge generated according to an amount of received light in the photoelectric conversion unit 15 of each pixel 10 to the column signal processing circuit 6 through a vertical signal line 13.

The column signal processing circuit 6 is disposed, for example, for each of the pixel columns 11 arranged in the X direction, and performs signal processing such as noise removal on signals output from the pixels 10 of one row for each of the pixel columns 11 arranged in the X direction. Examples of the signal processing include correlated double sampling (CDS) for removing pixel-specific fixed pattern noise and analog digital (AD) conversion.

The horizontal drive circuit 7 includes, for example, a shift register, sequentially outputs a horizontal scanning pulse to the column signal processing circuits 6, sequentially selects each of the column signal processing circuits 6, and allows each of the column signal processing circuits 6 to output a pixel signal subjected to signal processing to a horizontal signal line 14.

The output circuit 8 performs signal processing on the pixel signal sequentially supplied from each of the column signal processing circuits 6 through the horizontal signal line 14, and outputs the pixel signal. Examples of the signal processing include buffering, black level adjustment, column variation correction, and various types of digital signal processing.

The control circuit 9 generates a clock signal or a control signal serving as a reference of operations of the vertical drive circuit 5, the column signal processing circuits 6, the horizontal drive circuit 7, and the like on the basis of a vertical synchronization signal, a horizontal synchronization signal, and a master clock signal. Then, the control circuit 9 outputs the generated clock signal and control signal to the vertical drive circuit 5, the column signal processing circuits 6, the horizontal drive circuit 7, and the like.

[1-2 Pixel Circuit]

Next, a pixel circuit of each pixel 10 of the solid-state imaging element 1 will be described.

Figure 2:
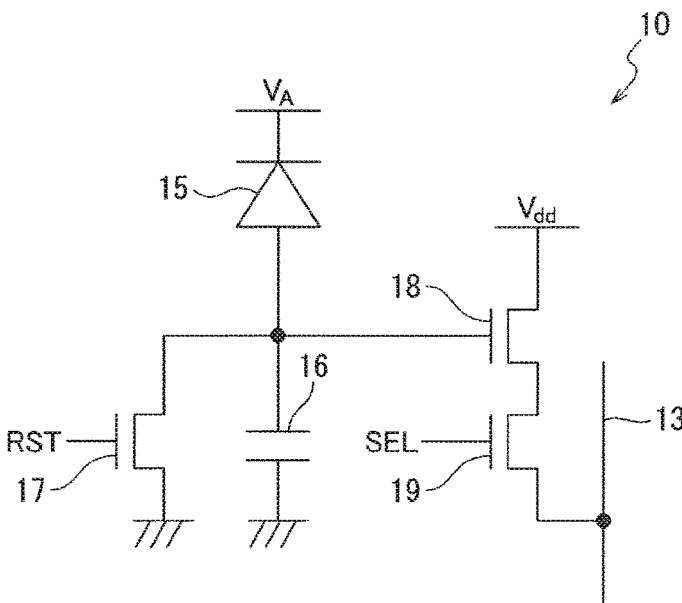
FIG. 2 is a diagram in which a core of the solid-state imaging element illustrates a pixel circuit thereof.

FIG. 2 is a diagram illustrating a configuration example of the pixel circuit.

As illustrated in FIG. 2, the pixel 10 includes a photoelectric conversion unit 15, a capacitive element 16, a reset transistor 17, an amplifier transistor 18, and a selection transistor 19.

The photoelectric conversion unit 15 includes a semiconductor thin film of a compound semiconductor, and generates a charge (signal charge) corresponding to the amount of received light. A predetermined bias voltage Va is applied to the photoelectric conversion unit 15.

The capacitive element 16 accumulates the signal charge generated by the photoelectric conversion unit 15. The capacitive element 16 is constituted by, for example, any of a PN junction capacitance, a MOS capacitance, and a wiring capacitance.

When turned on by a reset signal RST, the reset transistor 17 discharges the signal charge accumulated in the capacitive element 16 to the ground, and resets the potential of the capacitive element 16.

The amplifier transistor 18 outputs a pixel signal corresponding to the storage potential of the capacitive element 16. Specifically, the amplifier transistor 18 constitutes a source follower circuit with a load MOS as a constant current source connected via the vertical signal line 13. The source follower circuit outputs a pixel signal indicating a level corresponding to the signal charge accumulated in the capacitive element 16 from the amplifier transistor 18 to the column signal processing circuit 6 via the selection transistor 19 and the vertical signal line 13.

The selection transistor 19 is turned on when the pixel 10 is selected by a selection signal SEL, and outputs the pixel signal of the pixel 10 to the column signal processing circuit 6 via the vertical signal line 13. The signal line to which the selection signal SEL and the reset signal RST are transmitted corresponds to the pixel drive line 12 in FIG. 1.

[1-3 Configuration of Main Part]

Next, the detailed structure of the solid-state imaging element 1 will be described.

Figure 3:
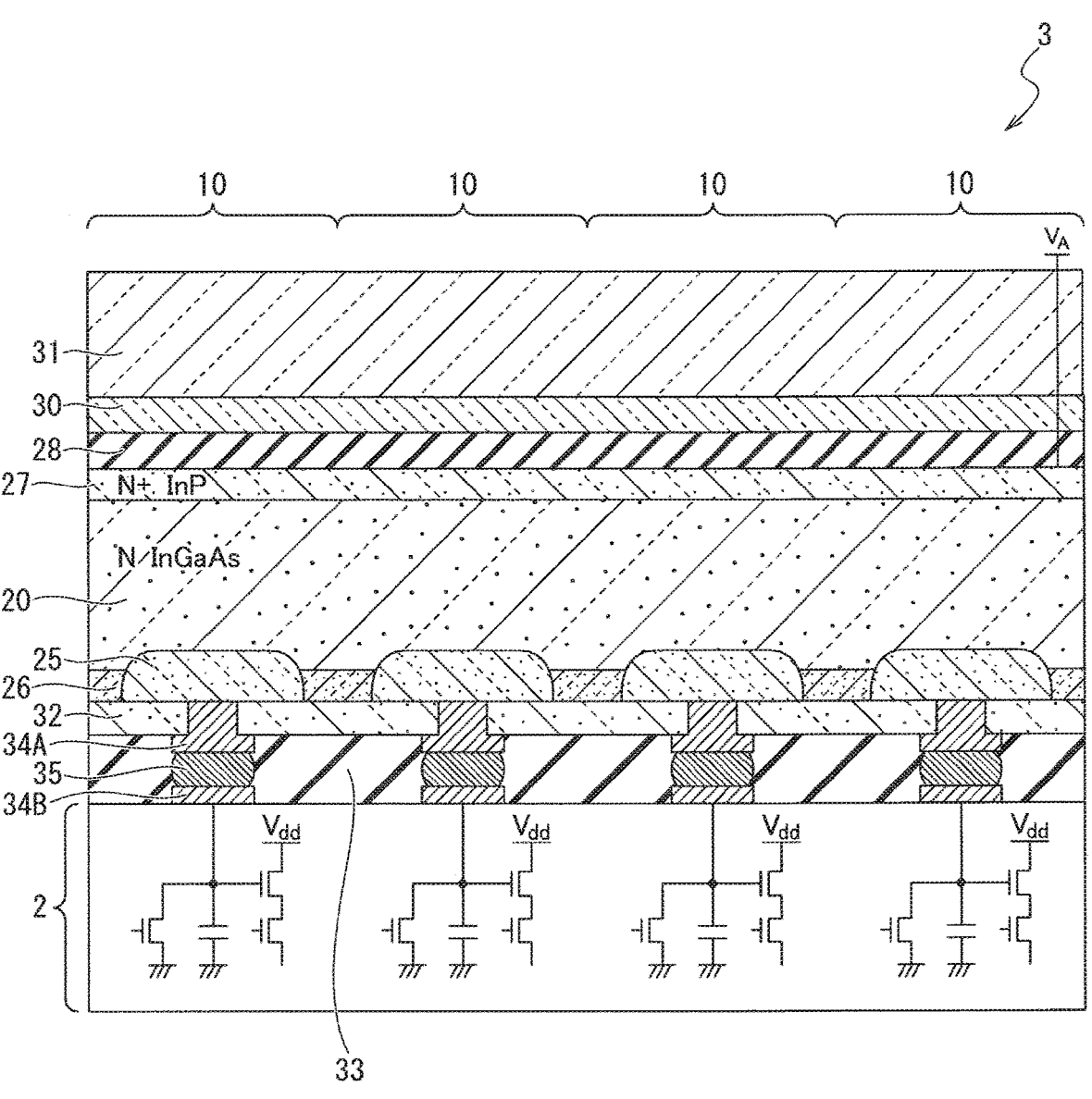
FIG. 3 is a diagram illustrating a cross-sectional configuration of a pixel region cut along line A-A in FIG. 1.

FIG. 3 is a diagram illustrating a cross-sectional configuration of the pixel region 3 cut along line A-A in FIG. 1. In addition, FIG. 4 is a diagram illustrating a cross-sectional configuration of the pixel region 3 cut along line B-B in FIG. 1.

Figures 4, 5:
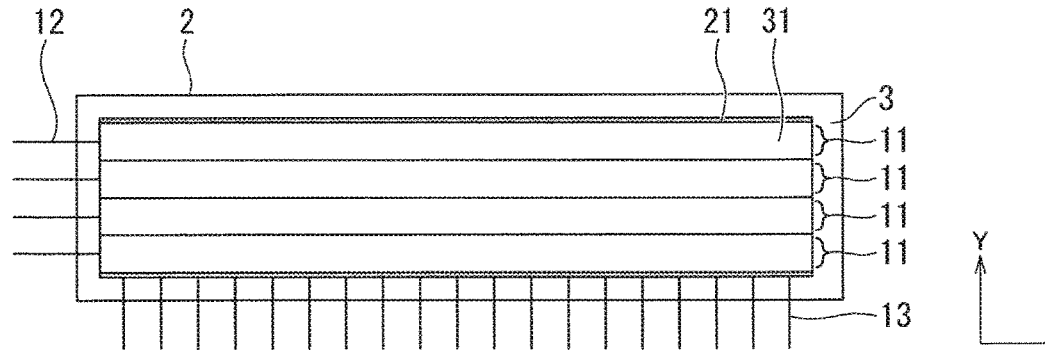
FIG. 4 is a diagram illustrating a cross-sectional configuration of the pixel region cut along line B-B in FIG. 1.
FIG. 5 is a diagram illustrating the pixel region of the solid-state imaging element.

As illustrated in FIGS. 3 and 4, the semiconductor substrate 2 includes, for example, a single crystal material such as single crystal silicon (Si). The semiconductor substrate 2 has formed therein the capacitive elements 16, the reset transistors 17, the amplifier transistors 18, and the selection transistors 19 of the respective pixels 10 described with reference to FIG. 2. Note that FIG. 3 does not illustrate the reference signs of the capacitive element 16, the reset transistor 17, the amplifier transistor 18, and the selection transistor 19 of the semiconductor substrate 2.

An N-type semiconductor thin film 20 to be the photoelectric conversion unit 15 illustrated in FIG. 2 is formed on a light entrance side (upper side in FIGS. 3 and 4) of the semiconductor substrate 2 for each pixel column 11 arranged in the X direction. That is, each of the N-type semiconductor thin films 20 is shared by the plurality of pixels 10 arranged in the X direction. FIG. 3 illustrates a case where four N-type semiconductor thin films 20 extending in the X direction are arranged on the light entrance side of the semiconductor substrate 2 so as to correspond to the pixel columns 11 arranged in the X direction. As a material of the N-type semiconductor thin film 20, a compound semiconductor containing any of InGaAs, Ex. InGaAs, InGaAs/GaAsSb superlattice, and InSb can be used, for example. FIGS. 3 and 4 illustrate a case where an InGaAs compound semiconductor is used as the N-type semiconductor thin film 20.

Furthermore, as illustrated in FIGS. 1 and 4, pixel separating sections 21 for separating the pixel columns 11 are formed between the adjacent N-type semiconductor thin films 20 and between the N-type semiconductor thin films 20 on the Y direction side and the opposite side (the N-type semiconductor thin films 20 on the upper end side and the lower end side in FIG. 1) and adjacent regions 40 adjacent to the pixel region 3. The pixel separating sections 21 are linearly formed on the semiconductor substrate 2 so as to sandwich the N-type semiconductor thin film 20. That is, each of the pixel separating sections 21 is formed only at a pixel boundary extending in the X direction. Examples of a pixel boundary used as the pixel boundary extending in the X direction include a pixel boundary between the N-type semiconductor thin films 20 and a pixel boundary between the N-type semiconductor thin films 20 on the Y direction side and the opposite side and the adjacent regions 40 adjacent to the pixel region 3. Due to the formation of the pixel separating section 21 only at the pixel boundary extending in the X direction, it is possible to minimize crosstalk in which a signal charge generated in one pixel column 11 is read in another pixel column 11. Furthermore, the plurality of pixels 10 in the pixel region 3 is divided into a plurality of pixel groups by the pixel separating sections 21. FIG. 1 illustrates a case where the divided pixel group and the pixel column 11 arranged in the X direction are the same. Note that FIG. 1 does not illustrate a high-concentration N-type layer 27, an antireflection film 28, an on-chip lens 31, and the like so that the configuration of the pixel separating section 21 and the configuration of an optical filter 30 are clearly seen.

The pixel separating section 21 has a trench 22 (groove) penetrating the N-type semiconductor thin film 20 in the thickness direction. The trench 22 is linearly formed in the semiconductor substrate 2 such that the inner side surface defines the outer shape of the pixel separating section 21. In addition, an insulating film 23 and a metal film 24 are laminated in this order on the inner side surface of the trench 22 so as to cover the entire inner side surface. That is, the pixel separating section 21 includes the trench 22 formed between the adjacent N-type semiconductor thin films 20, the insulating film 23 disposed inside the trench 22, and the metal film 24 embedded in the insulating film 23. Examples of a material usable for the insulating film 23 include silicon oxide ($SiO_2$) and aluminum oxide ($Al_2O_3$). In addition, examples of a material usable for the metal film 24 include metal such as tungsten (W), titanium (Ti), aluminum (Al), copper (Cu), and tantalum (Ta). By using the metal film 24, light can be reflected by the metal film 24, so that entry of light from one pixel column 11 to another pixel column 11 can be prevented. Thus, optical color mixing can be suppressed. In addition, as a method for forming the insulating film 23, a chemical vapor deposition (CVD) method can be used, for example. That is, the insulating film 23 may be an epitaxial growth film formed by the CVD method.

A high-concentration P-type layer 25 constituting a pixel electrode is formed for each pixel 10 on the semiconductor substrate 2 side (lower side in FIGS. 3 and 4) of the N-type semiconductor thin film 20. An N-type layer 26 is formed between the high-concentration P-type layers 25 as a pixel separating region for electrically separating the pixels 10. As a material of the N-type layer 26, a compound semiconductor such as InP can be used, for example. The N-type layer 26 has a function of suppressing generation of dark current in addition to the function as a pixel separating region.

On the other hand, the high-concentration N-type layer 27 is also formed on the light entrance side of the N-type semiconductor thin film 20 using a compound semiconductor such as InP used for the pixel separating region. The high-concentration N-type layer 27 functions as a barrier layer that prevents a reverse flow of signal charges generated in the N-type semiconductor thin film 20.

The antireflection film 28 is formed on the light entrance side of the high-concentration N-type layer 27. Examples of a material usable for the antireflection film 28 include silicon nitride (SiN), hafnium oxide ($HfO_2$), aluminum oxide ($Al_2O_3$), zirconium oxide ($ZrO_2$), tantalum oxide ($Ta_2Ta_5$), and titanium oxide ($TiO_2$). Either the high-concentration N-type layer 27 or the antireflection film 28 also functions as an upper electrode holding the N-type semiconductor thin film 20, and a predetermined bias voltage Va is applied thereto.

A light shielding film 29 that shields incident light is formed on the light entrance side of the antireflection film 28. The light shielding film 29 is formed above the pixel separating section 21 so as to open the light entrance side of each of the N-type semiconductor thin films 20. That is, each of the light shielding films 29 is disposed on the light entrance side of the N-type semiconductor thin film 20 and the pixel separating section 21, and is formed linearly along the pixel separating section 21. Since the light shielding film 29 is formed linearly along the pixel separating section 21, light reflected by the light shielding film 29 can be reduced as compared with the case where, for example, the light shielding film 29 have a lattice shape, and thus, the sensitivity of each pixel 10 can be improved.

The optical filter 30 having predetermined optical characteristics is formed on the light entrance side of the antireflection film 28 and the light shielding film 29 for each pixel column 11 (that is, for each pixel group divided by the pixel separating section 21) arranged in the X direction. That is, each pixel group includes the optical filter 30 formed in common for the pixels 10 included in the pixel group. FIGS. 3 and 4 illustrate a case where four optical filters 30 extending in the X direction are arranged corresponding to the N-type semiconductor thin films 20 extending in the X direction. Since the optical filter 30 is provided for each pixel column 11, light in a plurality of wavelength bands can be captured by one solid-state imaging element 1 (multi-line sensor).

Examples of a material usable for the optical filter 30 includes a compound semiconductor containing any of InGaAs, GaAsSb, InGaAsP, InGaAlAs, InP, InAlAs, InAlAsSb, AlAsSb, InAsP, and InSbP. By using the compound semiconductor, a low-pass filter, a high-pass filter, or the like can be formed as the optical filter 30. FIG. 1 illustrates a case where the optical filters 30 have different optical characteristics.

As illustrated in FIGS. 3, 4, and 5, the on-chip lens 31 that collects incident light on the N-type semiconductor thin film 20 is formed on the light entrance side of optical filter 30 for each pixel column 11 (that is, for each pixel group divided by the pixel separating section 21) arranged in the X direction. That is, each pixel group includes the on-chip lens 31 formed in common for the pixels 10 included in the pixel group. FIGS. 3 to 5 illustrate a case where four on-chip lenses 31 extending in the X direction are arranged corresponding to the N-type semiconductor thin films 20 extending in the X direction. FIG. 5 illustrates the on-chip lens 31 not illustrated in FIG. 1. The on-chip lens 31 may have, for example, a cylindrical shape in which the cross section on a plane perpendicular to the X direction has a D-shape as illustrated in FIG. 4, and a planar surface as viewed from the light entrance side has a rectangular shape as illustrated in FIG. 5. Due to the cylindrical shape, a gap between the on-chip lenses 31 can be reduced as compared with a case where, for example, the hemispherical on-chip lens 31 is formed for each pixel 10, and thus, light can be appropriately collected by the on-chip lens 31, and the sensitivity of 9 of each pixel can be improved.

A passivation layer 32 and an insulating layer 33 are formed below the high-concentration P-type layer 25 constituting the pixel electrode and the N-type layer 26 as the pixel separating region. The passivation layer 32 and the insulating layer 33 have connection electrodes 34A and 34B and a bump electrode 35 which penetrate therethrough. The connection electrodes 34A and 34B and the bump electrode 35 electrically connect the high-concentration P-type layer 25 constituting the pixel electrode and the capacitive element 16 that accumulates signal charges.

As described above, the solid-state imaging element 1 according to the first embodiment includes the plurality of pixels 10 arranged in a two-dimensional matrix in the X direction and the Y direction and including the photoelectric conversion unit 15 (N-type semiconductor thin film 20) containing a compound semiconductor. In addition, the solid-state imaging element 1 includes the pixel separating section 21 disposed only at a pixel boundary extending in the X direction. Therefore, the pixel separating section 21 is not formed between the pixels 10 in the same pixel column 11, whereby a decrease in the volume of the photoelectric conversion unit 15 can be suppressed, and a decrease in the quantum efficiency in the photoelectric conversion unit 15 can be suppressed. In addition, due to the formation of the pixel separating section 21 between the different pixel columns 11, it is possible to minimize crosstalk in which a signal charge generated in one pixel column 11 is read in another pixel column 11. Therefore, the solid-state imaging element 1 can be provided which is capable of minimizing crosstalk between different pixel columns 11 while suppressing a decrease in quantum efficiency of the photoelectric conversion unit 15 due to the pixel separating section. Furthermore, by preventing crosstalk, wavelength separation between different pixel columns 11 can be improved.

[1-4 Modification]

Figure 6:
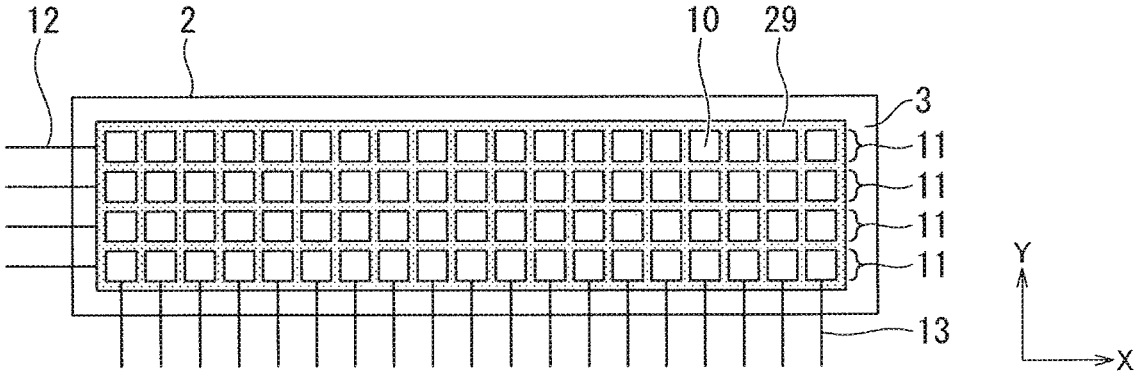
FIG. 6 is a diagram illustrating a pixel region of a solid-state imaging element according to a modification.

(1) Note that, although the first embodiment has described an example in which the light shielding film 29 has a linear shape along the pixel separating section 21, other configurations may also be applied. For example, as illustrated in FIG. 6, the light shielding film 29 may have a lattice shape along all pixel boundaries. Specifically, the light shielding film 29 may be formed above the N-type semiconductor thin film 20 and the pixel separating section 21 so as to open the light entrance side of each pixel 10. Due to the configuration in which the light shielding film 29 has a lattice shape along the boundaries of the pixels 10, light incident on the periphery of the pixel boundary can be shielded, generation of signal charges around the pixel boundary can be prevented, and the occurrence of crosstalk can be suppressed. Note that FIG. 6 does not illustrate the optical filter 30, the on-chip lens 31, and the like so that the configuration of the light shielding film 29 is clearly seen.

Figure 7:
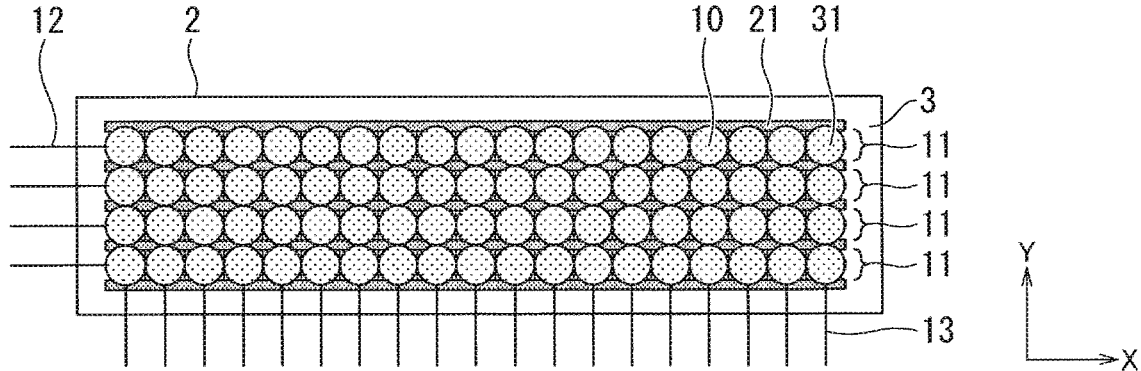
FIG. 7 is a diagram illustrating a pixel region of a solid-state imaging element according to the modification.

(2) Furthermore, although the first embodiment has described an example in which the on-chip lens 31 is formed for each pixel column 11 (that is, for each pixel group divided by the pixel separating section 21) arranged in the X direction, other configurations may also be applied. For example, as illustrated in FIG. 7, the on-chip lens 31 may be formed for each pixel 10. That is, each pixel 10 may include the on-chip lens 31 formed individually. A hemispherical lens can be used as the on-chip lens 31, for example. Due to the formation of the on-chip lens 31 for each pixel 10, crosstalk can be reduced, and further, a decrease in resolution can be suppressed.

Figure 8:
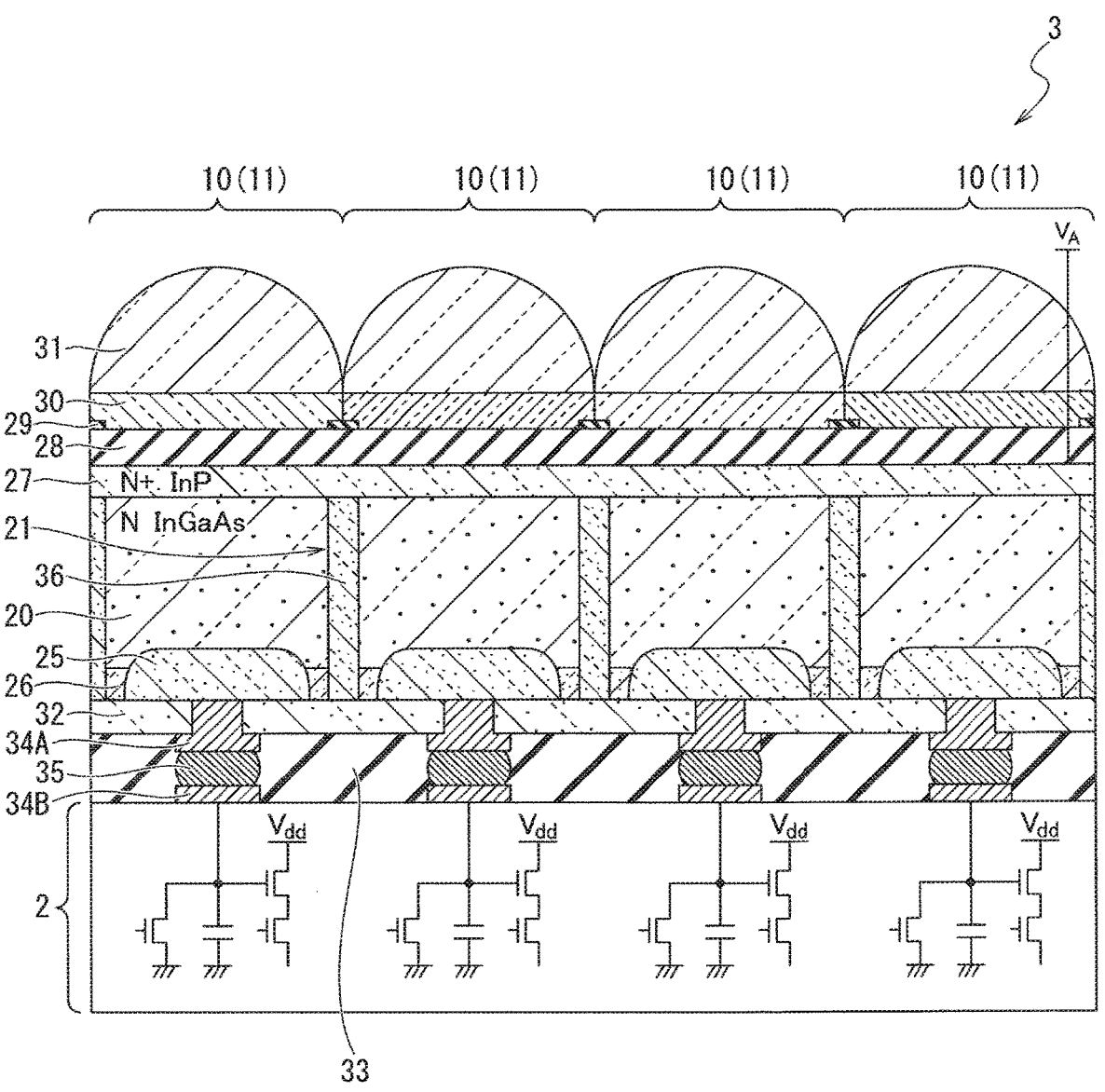
FIG. 8 is a diagram illustrating a cross-sectional configuration of a pixel region cut along line B-B in FIG. 1 in a solid-state imaging element according to the modification.

(3) Furthermore, although the first embodiment has described an example in which the pixel separating section 21 includes the trench 22 formed between the adjacent N-type semiconductor thin films 20 and the insulating film 23 disposed inside the trench 22, other configurations can also be applied. For example, as illustrated in FIG. 8, the pixel separating section 21 may be formed between the adjacent N-type semiconductor thin films 20 (photoelectric conversion units 15), and may be an impurity region 36 of a type opposite to the N-type semiconductor thin film 20 or an impurity region 36 of the same type as the N-type semiconductor thin film 20 and having a higher impurity concentration than the N-type semiconductor thin film 20. Examples of a usable impurity include a P-type impurity that insulates and electrically isolates the N-type semiconductor thin films 20 from each other, and a high-concentration N-type impurity. Examples of the P-type impurity include silicon (Si), germanium (Ge), and carbon (C). In addition, as the N-type impurity, an impurity same as the impurity of the N-type semiconductor thin film 20 can be used, for example. By having the impurity region 36, interface defects can be suppressed, and generation of dark current can be prevented.

Figure 9:
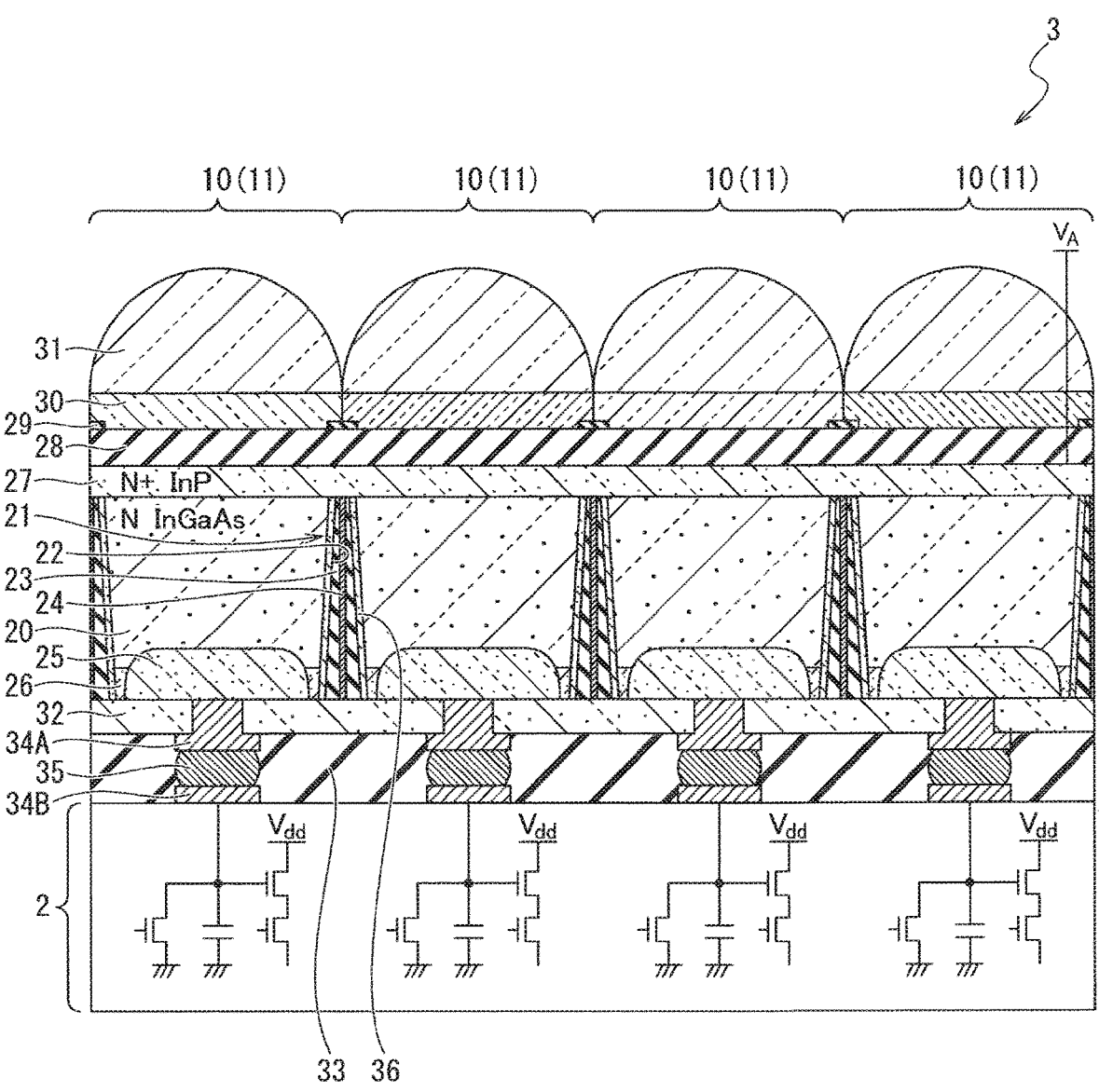
FIG. 9 is a diagram illustrating a cross-sectional configuration of the pixel region cut along line B-B in FIG. 1 in the solid-state imaging element according to the modification.

Furthermore, for example, the pixel separating section 21 may be obtained by combining the pixel separating section 21 in the first embodiment and the pixel separating section 21 in the modification described above. That is, as illustrated in FIG. 9, the pixel separating section 21 may include the trench 22 formed between the adjacent N-type semiconductor thin films 20 (photoelectric conversion units 15), the insulating film 23 (epitaxial growth film) disposed inside the trench 22, the metal film 24 embedded in the insulating film 23, and the impurity region 36 (hereinafter, also referred to as "pinning layer 36") formed between the trench 22 and the N-type semiconductor thin film 20. The pinning layer 36 has a charge opposite to a signal charge generated by photoelectric conversion as a carrier. In a case where the signal charges are, for example, holes, the pinning layer 36 is constituted by N-type InGaAs. In addition, in a case where the signal charges are, for example, electrons, the pinning layer 36 is constituted by P-type InGaAs. As a method for forming the pinning layer 36, a method for doping the compound semiconductor layer with impurities can be employed, for example. Due to the pinning layer 36 being provided, unnecessary carriers caused by interface defects or the like can be pinned, and generation of dark current can be suppressed.

Figure 10:
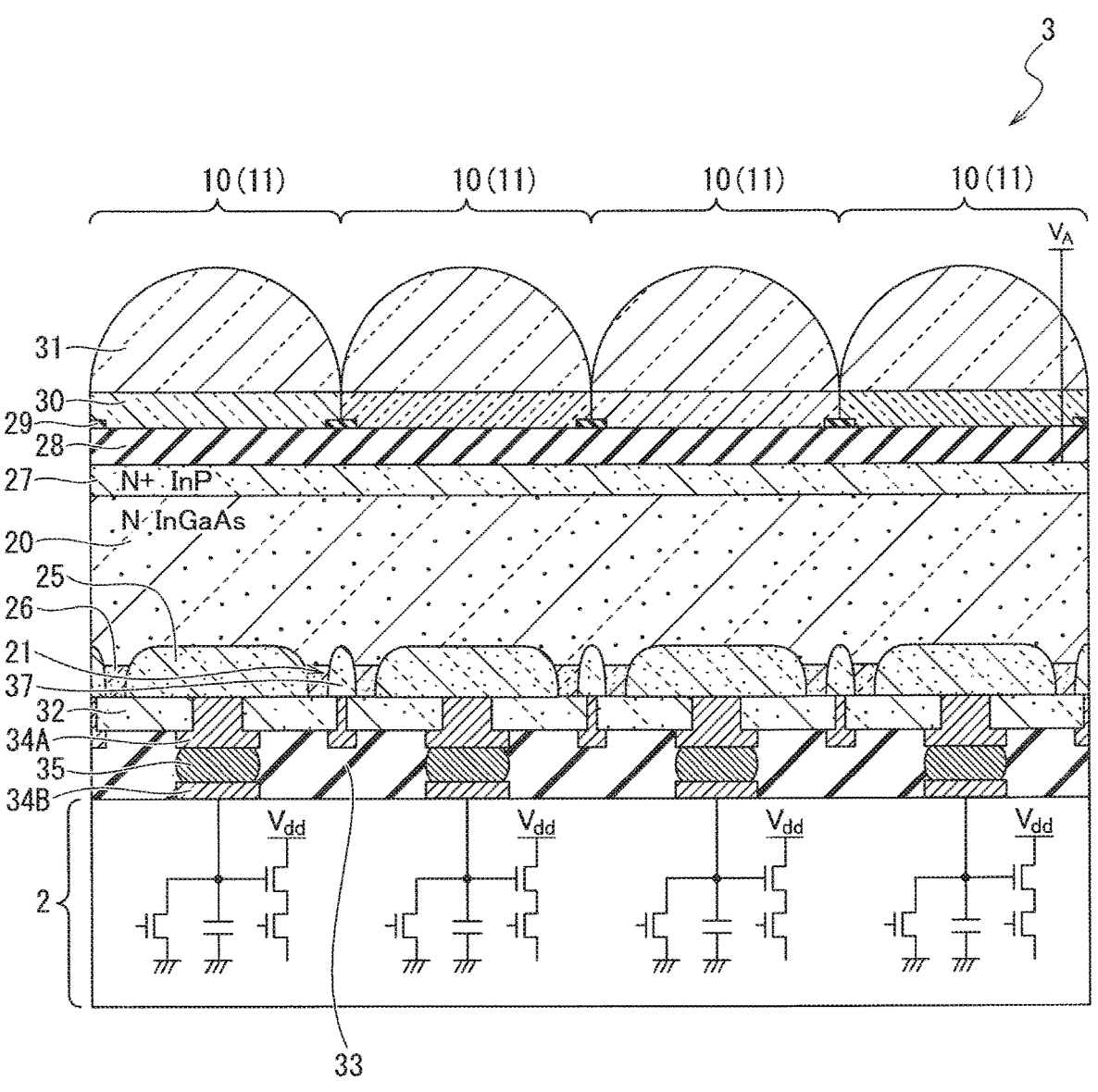
FIG. 10 is a diagram illustrating a cross-sectional configuration of a pixel region cut along line B-B in FIG. 1 in a solid-state imaging element according to the modification.

Furthermore, the pixel separating section 21 may be formed between adjacent pixel electrodes (high-concentration P-type layers 25) and form an impurity region 37 of the same type as the pixel electrodes as illustrated in FIG. 10, for example. As the impurity, an impurity same as that of the pixel electrode can be used, for example. In addition, the impurity region 37 is maintained at a potential equal to or lower than that of the pixel electrode. For example, the impurity region 37 is connected to the ground. Due to the formation of the impurity region 37, signal charges generated around the pixel boundary extending in the X direction can be absorbed by the impurity region 37 and discharged to the ground, whereby crosstalk in which signal charges generated around the pixel boundary of one pixel column 11 are read by another pixel 10 can be suppressed.

Figure 11:
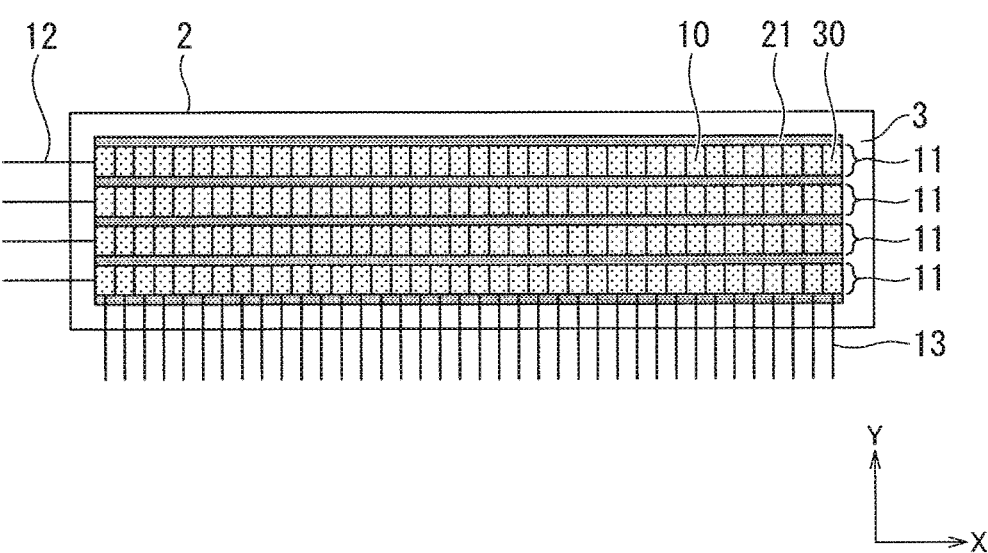
FIG. 11 is a diagram illustrating a pixel region of a solid-state imaging element according to the modification.

(4) Furthermore, although the first embodiment has described an example in which a square pixel is used as the pixel 10, other configurations can also be applied. For example, as illustrated in FIG. 11, a rectangular pixel in which the length in the X direction is shorter than the length in the Y direction may be used as the pixel 10. By using a pixel in which the length in the X direction is shorter than the length in the Y direction, the number of pixels 10 constituting the pixel column 11 arranged in the X direction can be increased while maintaining the area of light receiving surfaces of the pixels 10, whereby the resolution can be improved, for example.

Figure 12:
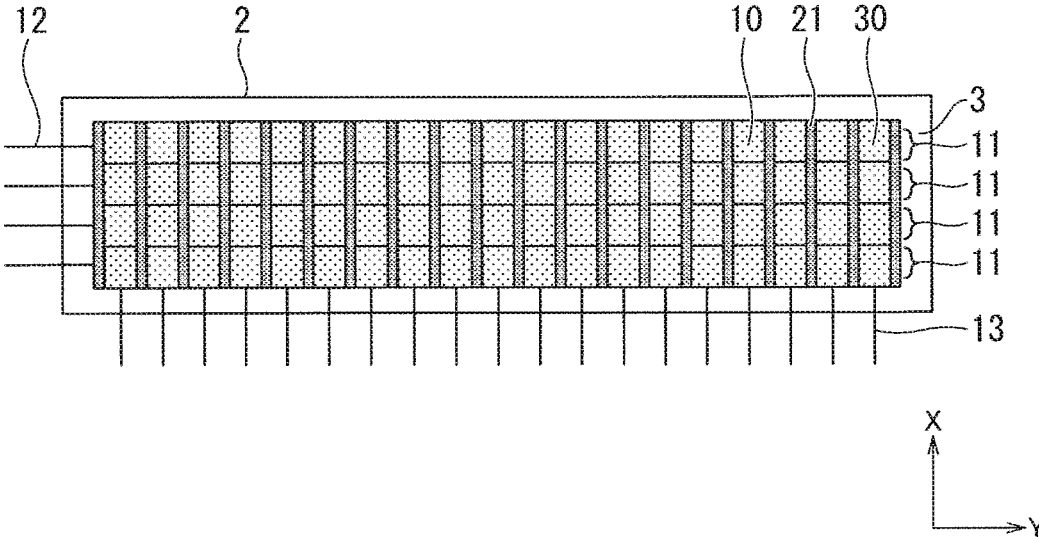
FIG. 12 is a diagram illustrating a pixel region of a solid-state imaging element according to the modification.

(5) Furthermore, although the first embodiment has described an example in which the pixel separating section 21 is formed along the longitudinal direction of the pixel region 3, other configurations may also be applied. For example, as illustrated in FIG. 12, the pixel separating section 21 may be formed along the short direction of the pixel region 3. In the case where the pixel separating section 21 is formed along the short direction of the pixel region 3, the short direction is defined as the X direction, and the longitudinal direction is defined as the X direction.

2. SECOND EMBODIMENT

[2-1 Configuration of Main Part]

Next, a solid-state imaging element 1 according to a second embodiment of the present disclosure will be described.

Figure 13:
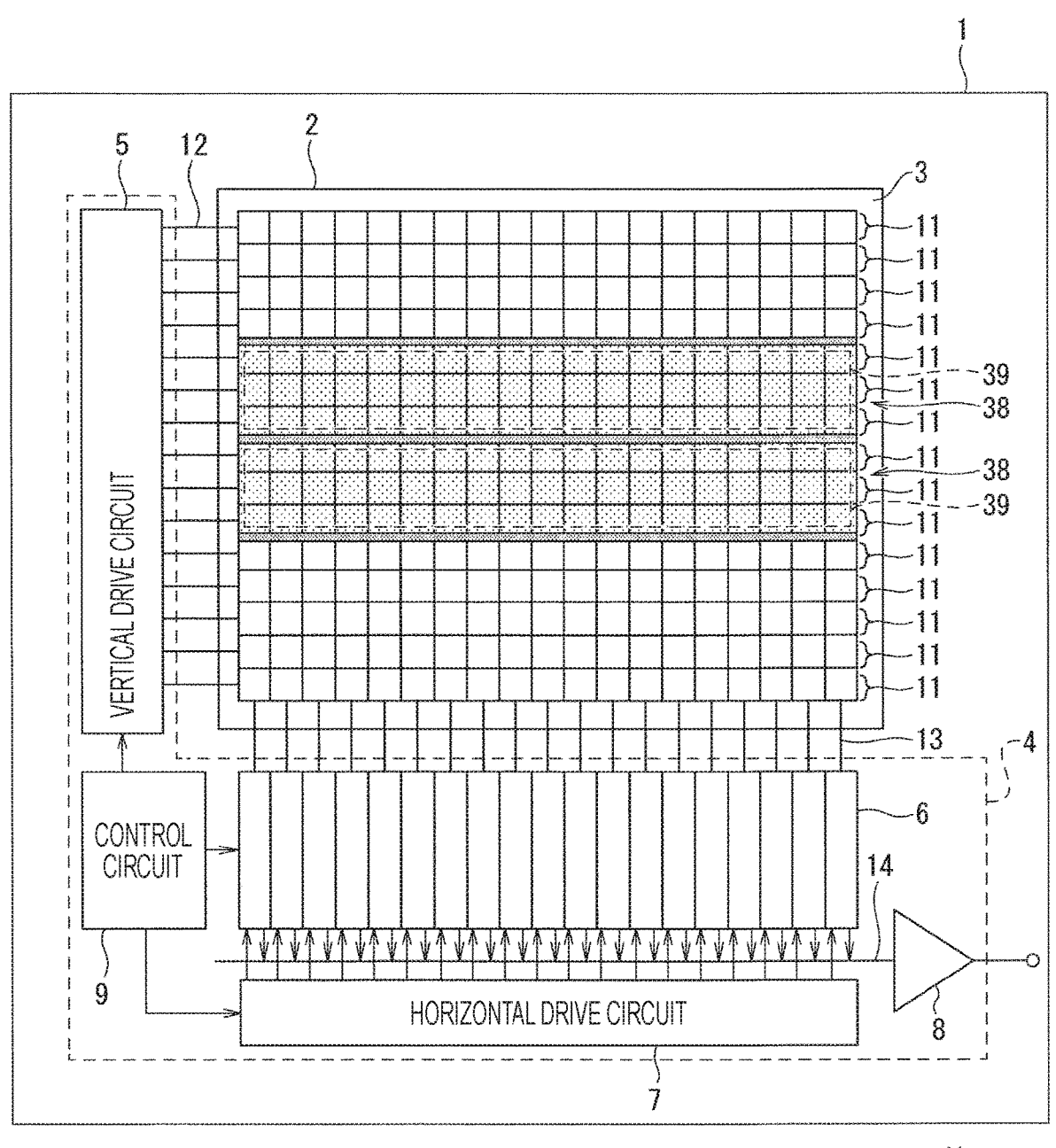
FIG. 13 is a diagram illustrating an overall configuration of a solid-state imaging element according to a first embodiment.

FIG. 13 is a schematic diagram illustrating an overall configuration of the solid-state imaging element according to the second embodiment of the present disclosure. In FIG. 13, portions corresponding to those in FIG. 1 are denoted by the same reference numerals, and redundant description will be omitted.

In the second embodiment, in the pixel region 3, the number of pixel columns 11 arranged in the X direction is larger than the number of line sensors 38 constituting a multi-line sensor as illustrated in FIG. 13. FIG. 13 illustrates a case where the number of pixel columns 11 arranged in the X direction is "fifteen" and the number of line sensors 38 is "two". Furthermore, the pixel separating sections 21 are formed only in the central portion of the pixel region 3. Each of the pixel separating sections 21 is arranged such that a plurality of pixel columns 11 arranged in the X direction is sandwiched between the adjacent pixel separating sections 21. FIG. 13 illustrates a case where three pixel separating sections 21 are formed such that three pixel columns 11 arranged in the X direction are sandwiched between the adjacent pixel separating sections 21. With this configuration, the pixel separating sections 21 divide some of the plurality of pixels 10 in the pixel region 3 into a plurality of pixel groups 39. That is, each of the plurality of pixel groups 39 has a plurality of pixel columns 11 arranged in the X direction.

Furthermore, in the second embodiment, the peripheral circuit 4 is configured to read only the signal charges of the pixels 10 included in the pixel group 39 divided by the pixel separating sections 21. As a result, each of the pixel groups 39 can be used as one line sensor. In addition, as a method for reading only the signal charges of the pixels 10 included in the pixel group 39, a method for driving, by the vertical drive circuit 5, only the pixels 10 included in the pixel group 39 divided by the pixel separating sections 21 can be used, for example.

In addition, the peripheral circuit 4 is configured to add signal charges of the pixels 10 arranged in the Y direction for each pixel group 39. As a method for adding the signal charges of the pixels 10 arranged in the Y direction, a method for simultaneously reading the signal charges of the pixels 10 arranged in the Y direction to the vertical signal line 13 can be used, for example. As a result, in each pixel group 39 (each line sensor), the pixels 10 arranged in the Y direction can be used as one large pixel, whereby the sensitivity of each pixel can be improved.

As described above, the solid-state imaging element 1 according to the second embodiment has a configuration in which the peripheral circuit 4 reads only the signal charges of the pixels 10 included in the pixel group divided by the pixel separating sections 21. Therefore, an existing area sensor can be used as a multi-line sensor, for example. Thus, a multi-line sensor can be easily formed, and man-hours for developing the multi-line sensor can be reduced.

It is to be noted that the present disclosure may also have the following configurations.

(1)

A solid-state imaging element including:

a plurality of pixels arranged in a two-dimensional matrix in an X direction and a Y direction and including a photoelectric conversion unit containing a compound semiconductor; and a pixel separating section disposed only at a pixel boundary extending in the X direction.

(2)

The solid-state imaging element according to (1), in which the pixel separating section divides the plurality of pixels into a plurality of pixel groups, and the solid-state imaging element has an optical filter formed for each of the pixel groups and disposed on a light entrance side of the photoelectric conversion unit.

(3)

The solid-state imaging element according to (1) or (2), further including a light shielding film disposed on a light entrance side of the photoelectric conversion unit and the pixel separating section and formed linearly along the pixel separating section.

(4)

The solid-state imaging element according (1) or (2), further including a light shielding film disposed on a light entrance side of the photoelectric conversion unit and the pixel separating section and formed to have a lattice shape along all pixel boundaries.

(5)

The solid-state imaging element according to any one of (1) to (4), in which the pixel separating section divides the plurality of pixels into a plurality of pixel groups, and the solid-state imaging element has a cylindrical on-chip lens formed for each of the pixel groups and disposed on a light entrance side of the photoelectric conversion unit.

(6)

The solid-state imaging element according to any one of (1) to (4), further including an on-chip lens formed for each of the pixels and disposed on a light entrance side of the photoelectric conversion unit.

(7)

The solid-state imaging element according to any one of (1) to (6), in which the pixel separating section includes a groove formed between the photoelectric conversion units that are adjacent to each other, and an insulating film provided inside the groove.

(8)

The solid-state imaging element according to (7), in which the pixel separating section further includes a metal film embedded in the insulating film.

(9)

The solid-state imaging element according to (7), in which the pixel separating section further includes a pinning layer formed between the groove and the photoelectric conversion unit.

(10)

The solid-state imaging element according to any one of (7) to (9), in which the insulating film is an epitaxial growth film.

(11)

The solid-state imaging element according to any one of (1) to (6), in which the pixel separating section is formed between the photoelectric conversion units which are adjacent to each other, the pixel separating section being an impurity region of a type opposite to a type of the photoelectric conversion unit, or an impurity region of a type same as the type of the photoelectric conversion unit and having a higher impurity concentration than the photoelectric conversion unit.

(12)

The solid-state imaging element according to any one of (1) to (6), in which the pixel separating section is formed between pixel electrodes of the photoelectric conversion units which are adjacent to each other, the pixel separating section being an impurity region of a type same as a type of the pixel electrodes.

(13)

The solid-state imaging element according to any one of (1) to (12), in which the compound semiconductor includes any of InGaAs, Ex. InGaAs, an InGaAs/GaAsSb superlattice, and InSb.

(14)

The solid-state imaging element according to (2), in which the optical filter includes, as a material, any of InGaAs, GaAsSb, InGaAsP, InGaAlAs, InP, InAlAs, InAlAsSb, AlAsSb, InAsP, and InSbP.

(15)

The solid-state imaging element according to any one of (1) to (14), in which each of the pixels has a rectangular shape in which a length in the X direction is shorter than a length in the Y direction.

(16)

The solid-state imaging element according to any one of (1) to (15), in which the pixel separating section divides a part of the plurality of pixels into a plurality of pixel groups, and the solid-state imaging element has a peripheral circuit that reads only a signal charge of the pixel included in the pixel group.

(17)

The solid-state imaging element according to (16), in which each of the plurality of pixel groups has a plurality of pixel columns arranged in the X direction, and the peripheral circuit adds signal charges of the pixels arranged in the Y direction for each of the pixel groups.

REFERENCE SIGNS LIST

1 Solid-state imaging element
2 Semiconductor substrate
3 Pixel region
4 Peripheral circuit
5 Vertical drive circuit
6 Column signal processing circuit
7 Horizontal drive circuit
8 Output circuit
9 Control circuit
10 Pixel
11 Pixel column 12 Pixel drive line
13 Vertical signal line
14 Horizontal signal line
15 Photoelectric conversion unit
16 Capacitive element
17 Reset transistor
18 Amplifier transistor
19 Selection transistor
20 N-type semiconductor thin film
21 Pixel separating section
22 Trench
23 Insulating film
24 Metal film
25 P-type layer
26 N-type layer
27 N-type layer
28 Antireflection film
29 Light shielding film
30 Optical filter
31 On-chip lens
32 Passivation layer
33 Insulating layer
34A, 34B Connection electrode
35 Bump electrode
36 Impurity region (pinning layer)
37 Impurity region
38 Line sensor
39 Pixel group
40 Adjacent region

The invention claimed is:

1. A solid-state imaging element, comprising:
a plurality of pixels in a two-dimensional matrix in an X direction and a Y direction, wherein
each pixel of the plurality of pixels includes a photoelectric conversion unit, and
the photoelectric conversion unit includes-containing a compound semiconductor;
a pixel separating section only at a pixel boundary that extends in the X direction, wherein
the pixel separating section divides the plurality of pixels into a plurality of pixel groups; and
a cylindrical on-chip lens for each pixel group of the plurality of pixel groups, wherein the cylindrical on-chip lens is on a light entrance side of the photoelectric conversion unit.

2. The solid-state imaging element according to claim 1, further comprising
an optical filter for each pixel group of the plurality of pixel groups, wherein the optical filter is on the light entrance side of the photoelectric conversion unit.

3. The solid-state imaging element according to claim 2, wherein the optical filter includes, as a material, one of InGaAs, GaAsSb, InGaAsP, InGaAlAs, InP, InAlAs, InAlAsSb, AlAsSb, InAsP, or InSbP.

4. The solid-state imaging element according to claim 1, further comprising
a light shielding film on the light entrance side of the photoelectric conversion unit and the pixel separating section, wherein the light shielding film is linearly along the pixel separating section.

5. The solid-state imaging element according to claim 1, further comprising
a light shielding film disposed on the light entrance side of the photoelectric conversion unit and the pixel separating section and formed to have a lattice shape along all pixel boundaries.

6. The solid-state imaging element according to claim 1, further comprising an on-chip lens formed for each of the plurality of pixels and disposed on the light entrance side of the photoelectric conversion unit.

7. The solid-state imaging element according to claim 1, wherein the plurality of pixels includes a first pixel and a second pixel, the pixel separating section includes a groove between the photoelectric conversion unit of the first pixel and the photoelectric conversion unit of the second pixel, the photoelectric conversion unit of the first pixel is adjacent to the photoelectric conversion unit of the second pixel, and the groove includes an insulating film.

8. The solid-state imaging element according to claim 7, wherein the pixel separating section further includes a metal film in the insulating film.

9. The solid-state imaging element according to claim 7, wherein the pixel separating section further includes a pinning layer between the groove and the photoelectric conversion unit.

10. The solid-state imaging element according to claim 7, wherein the insulating film is an epitaxial growth film.

11. The solid-state imaging element according to claim 1, wherein the plurality of pixels includes a first pixel and a second pixel, the pixel separating section is between the photoelectric conversion unit of the first pixel and the photoelectric conversion unit of the second pixel, the photoelectric conversion unit of the first pixel is adjacent to the photoelectric conversion unit of the second pixel, the pixel separating section is one of, an impurity region of a type opposite to a type of the photoelectric conversion unit, or an impurity region of a type same as the type of the photoelectric conversion unit and having a higher impurity concentration than the photoelectric conversion unit.

12. The solid-state imaging element according to claim 1, wherein the plurality of pixels includes a first pixel and a second pixel, the pixel separating section is between a first pixel electrode of the photoelectric conversion unit of the first pixel and a second pixel electrode of the photoelectric conversion unit of the second pixel, the photoelectric conversion unit of the first pixel is adjacent to the photoelectric conversion unit of the second pixel, and the pixel separating section is an impurity region of a type same as a type of the first pixel electrode and the second pixel electrode.

13. The solid-state imaging element according to claim 1, wherein the compound semiconductor includes one of InGaAs, Ex.InGaAs, an InGaAs/GaAsSb superlattice, or InSb.

14. The solid-state imaging element according to claim 1, wherein each of the plurality of pixels has a rectangular shape in which a length in the X direction is shorter than a length in the Y direction.

15. The solid-state imaging element according to claim 1, further comprising a peripheral circuit configured to read only a signal charge of a pixel, of the plurality of pixels, in a pixel group of the plurality of pixel groups.

16. The solid-state imaging element according to claim 15, wherein each of the plurality of pixel groups has a plurality of pixel columns in the X direction, and the peripheral circuit is further configured to add signal charges of a set of pixels, of the plurality of pixels, in the Y direction for each pixel group of the plurality of pixel groups.

17. A solid-state imaging element, comprising:

a plurality of pixels in a two-dimensional matrix in an X direction and a Y direction, wherein each pixel of the plurality of pixels includes a photoelectric conversion unit, and the photoelectric conversion unit includes a compound semiconductor; and a pixel separating section only at a pixel boundary that extends in the X direction, wherein the plurality of pixels includes a first pixel and a second pixel, the pixel separating section includes a groove between the photoelectric conversion unit of the first pixel and the photoelectric conversion unit of the second pixel, the photoelectric conversion unit of the first pixel is adjacent to the photoelectric conversion unit of the second pixel, and the groove includes an insulating film.

18. A solid-state imaging element, comprising:

a plurality of pixels in a two-dimensional matrix in an X direction and a Y direction, wherein each pixel of the plurality of pixels includes a photoelectric conversion unit, and the photoelectric conversion unit includes a compound semiconductor; and a pixel separating section only at a pixel boundary that extends in the X direction, wherein the plurality of pixels includes a first pixel and a second pixel, the pixel separating section is between a first pixel electrode of the photoelectric conversion unit of the first pixel and a second pixel electrode of the photoelectric conversion unit of the second pixel, the photoelectric conversion unit of the first pixel is adjacent to the photoelectric conversion unit of the second pixel, and the pixel separating section being an impurity region of a type same as a type of the first pixel electrode and the second pixel electrode.

* * * * *